US010461105B2

(12) United States Patent
Helmick

(10) Patent No.: US 10,461,105 B2
(45) Date of Patent: Oct. 29, 2019

(54) PHOTODIODE ARRAY

(71) Applicant: ams AG, Unterpremstaetten (AT)

(72) Inventor: Robert Allen Helmick, Allen, TX (US)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 15/777,604

(22) PCT Filed: Nov. 22, 2016

(86) PCT No.: PCT/EP2016/078453
§ 371 (c)(1),
(2) Date: May 18, 2018

(87) PCT Pub. No.: WO2017/089350
PCT Pub. Date: Jun. 1, 2017

(65) Prior Publication Data
US 2019/0244991 A1    Aug. 8, 2019

Related U.S. Application Data

(60) Provisional application No. 62/259,011, filed on Nov. 23, 2015.

(30) Foreign Application Priority Data

Dec. 15, 2015 (EP) .................... 15200148

(51) Int. Cl.
*H01L 27/146* (2006.01)
*H01L 27/144* (2006.01)

(52) U.S. Cl.
CPC .... *H01L 27/14605* (2013.01); *H01L 27/1446* (2013.01); *H01L 27/14607* (2013.01)

(58) Field of Classification Search
CPC ............ G01D 5/34715; G01J 1/4228; H01L 27/14605; H01L 27/1446; H01L 27/14607
See application file for complete search history.

(56) References Cited

U.S. PATENT DOCUMENTS 7,009,645 B1   3/2006  Sandini et al.
2007/0215794 A1   9/2007  Cernasov et al.
(Continued)

FOREIGN PATENT DOCUMENTS

EP        2453477 A1    5/2012
JP      H03116781 A    5/1991

*Primary Examiner* — Matthew L Reames
(74) *Attorney, Agent, or Firm* — Fish & Richardson P.C.

(57) ABSTRACT

A photodiode array is disclosed and comprises a first photodiode comprising a first set of spatially separate and electrically interconnected photodiode segments. A second photodiode comprises a second set of spatially separate and electrically interconnected photodiode segments. A first group of photodiode segments comprises photodiode segments from the first and/or second set of photodiode segments. The photodiode segments from the first group of photodiode segments are radially arranged around a common center of symmetry in a common first distance with respect to the common center of symmetry. A second group of photodiode segments comprises photodiode segments from the first and/or second set of photodiode segments. Photodiode segments from the second group of photodiode segments are radially arranged around the common center of symmetry in a second common distance with respect to the common center of symmetry, wherein the first distance is different from the second distance. Each photodiode has an area matched counterpart photodiode forming a matched pair of photodiodes. The matched counterpart photodiodes comprise a matched set of spatially separate and electrically interconnected photodiode segments. Each group of photodiode segments comprises the corresponding matched set of photodiode segments.

14 Claims, 8 Drawing Sheets

(56) References Cited

U.S. PATENT DOCUMENTS

2012/0168609 A1     7/2012   Krymski
2012/0281238 A1    11/2012   Hermann

PHOTODIODE ARRAY

The present invention relates to a photodiode array.

BACKGROUND OF THE INVENTION

Photodiodes are used as light sensors in many different fields of application such as proximity detection, color sensing, gesture detection and ambient light sensing. Photodiodes can be arranged into one- or two-dimensional arrays comprising a plurality of individual photodiodes. For example, the individual diodes are arranged in a square or rectangular configuration in order to make the best usage of the chip area available. Furthermore, each individual photodiode typically is constructed in a rectangular fashion, i.e. all edges meet in right angles.

Light sensors comprising photodiodes are typically designed to focus incident radiation on the center of the sensing photodiode embodiment. When the angle of incidence of the radiance source changes, however, illuminance across the photodiode structure will change, shifting illuminance to a different region of the photodiode structure. This diode exposure dependence on angular irradiance is not desirable and eventually results in poor optical performance.

SUMMARY OF THE INVENTION

In at least one embodiment a photodiode array comprises a first and second photodiode. The first photodiode comprises a first set of spatially separate and electrically interconnected photodiode segments. The second photodiode comprises a second set of spatially separate and electrically interconnected photo diode segments.

The photodiode segments can be individual photodiodes on their own, e.g. have individual pn-junctions. However, as the photodiode segments within any set are electrically interconnected they behave as a common, single photodiode, for example having the same effective sensitive surface area. In this sense the photodiode segments are subunits of the photodiodes. These subunits can be spatially spread out and may not overlap or directly contact to each other. The photodiodes may comprise one or more sets of photodiode segments.

The photodiode segments can be grouped into groups of photodiode segments. A first group of photodiode segments comprises photodiode segments from the first and/or second set of photodiode segments. The photodiode segments from the first group of photodiode segments are radially arranged around a common center of symmetry. All photodiode segments from the first group of photodiode segments are arranged in a common first distance with respect to the common center of symmetry.

The second group of photodiode segments comprises photodiode segments from the first and/or second set of photodiode segments. The photodiode segments from the second group of photodiode segments are radially arranged around the common center of symmetry. All photodiode segments from the second group of photodiode segments are arranged in a common second distance with respect to the common center of symmetry. Furthermore, the first distance is different from the second distance.

In other words the groups of photodiode segments may comprise segments from different sets but share a similar arrangement, e.g. all segments from one group have the same distance with respect to the common center of symmetry. The common distances of photodiode segments in any one group can be measured from respective centroids of the individual photodiode segments, for example the centroids of their light sensitive areas. The photodiode segments within one set may have the same shape and area so that the photodiode segments can be symmetrically arranged around the common center of symmetry.

The term "radially arranged" refers to the specific, symmetrical arrangement of segments with respect to the common center of symmetry. All segments from a given group share the same common distance, i.e. the common distance defines a circle around the common center of symmetry and all segments from said group are arranged on that particular circle. Furthermore, the segments may have geometrical properties that are aligned with that particular circle, e.g. an arc or edges pointing towards the common center of symmetry. The "radial arrangement" is different to a "rectangular arrangement" where the individual diodes are arranged in a square or rectangular configuration.

Sub-dividing the photodiodes and distributing in a radial, common centroid arrangement reduced illuminance shifting, i.e. dependence of photodiode exposure on angular irradiance. For example, photodiode area illuminance increases in one sub-divided photodiode segment while decreasing in radially arranged other sub-divided photodiode segment from the same set or group, resulting in a smaller net change due to angle of irradiance. Optimum photodiode sensing is to have sensing that is 100 percent invariant to radiance source angle. This solution helps to greatly reduce angular dependence in area constrained diode sensing designs while maintaining diode ratios.

In at least one embodiment the photodiode array further comprises at least a third photodiode. The third photodiode comprises a third set of spatially separate and electrically interconnected photodiode segments. In addition, at least a third group of photodiode segments comprises photodiode segments from the first, second and/or third set of photodiode segments. Alternatively, the first and/or second group comprises photodiode segments from the first, second and/or third set of photodiode segments.

The photodiode segments from the third group of photodiode segments are radially arranged around the common center of symmetry and have a third common distance with respect to the common center of symmetry. The third common distance can be the same as the first or second common distance or, alternatively, be different than the first and second common distance. For example, the first, second and third groups of photodiode segments can be arranged in different distances with respect to the common center of symmetry such as aligned along different concentric circles.

By introducing several groups of photodiode segments the individual segments can be distributed in the array in a space efficient manner, for example by filling in gaps between segments. A higher level of symmetry can thus be introduced into the photodiode array. This way also the dependence of photodiode exposure on angular irradiance or irradiance shifting can be further reduced. Please note, that any number photodiodes and groups of photodiode segments can be implemented into the photodiode array, i.e. at least two groups, three, four or more.

In at least one embodiment each photodiode in the photodiode array has an area matched counterpart photodiode. The respective photodiodes and their counterpart photodiodes form matched pairs of photodiodes. Matched pairs may be comprised by the same group of photodiode segments. Furthermore, the matched counterpart photodiodes each comprise a matched set of spatially separate and electrically interconnected photodiode segments. Each group of photodiode segments further comprises the corresponding matched set of photodiode segments.

By matching the photodiodes into matched pairs their response to incident light can be adjusted. Matching of photodiodes is also reflected in matching the individual photodiode segments in a set of photodiode segments. Additionally, matching defines photodiode area relationships relative to each other and a photodiode total area Dtot can be defined as a linear combination of the areas of all matched pairs of photodiode segments in the array. In an appropriate arrangement of the photodiode segments within each group using matching of segments the photodiode area illuminance increases in one sub-divided photodiode segment while decreasing the same amount in the radially opposing sub-divided photodiode segment, resulting in net zero change due to angle of irradiance. In other words the matching of photodiodes and photodiode segments introduces another level of symmetry into the photodiode array. Symmetry thus involves arrangement of the photodiodes of photodiode segments spatially but also with respect to light sensitive area.

In at least one embodiment one or more of the photodiodes comprise at least one interdigitated set of spatially separate and electrically interconnected photodiode segments. A group of interdigitated photodiode segments or, alternatively or additionally, other groups of photodiode segments comprises photodiode segments from the at least one interdigitated set of photodiode segments. The photodiode segments from the interdigitated group of photodiode segments are radially arranged around the common center of symmetry in a common distance or in different distances.

For example, the photodiode segments from the at least one interdigitated set of photodiode segments may be part of different. The interdigitated set of photodiode segments, however, may form an additional group in a different distance compared to the other groups. Furthermore, the photodiode segments from the interdigitated set can have different shape compared to other photodiode segments from other sets.

As an example the first photodiode may comprise the first set of photodiode segments and other segments from one set of interdigitated photodiode segments. These segments, taken as a whole, constitute the first photodiode, for example. The photodiode segments from the first set may be arranged in the common first distance with respect to the center. The photodiode segments from the interdigitated group, however, can be arranged into different distance. This concept may be applied to all groups or sets of photodiode segments.

The interdigitated set of photodiode segments allows for an additional degree of freedom in the design of the photodiode array. Sizing of the photodiode areas and their respective distances can easily be set and arranged to fill possible gaps between the photodiode segments.

In at least one embodiment a light sensitive area of a photodiode has a non-rectangular shape. The photodiode light sensitive area may have polygonal shape such as a triangle, pentagon or hexagon, i.e. not all edges necessarily have to meet in right angles.

In at least one embodiment within each group of photodiode segments of the light sensitive areas of the photodiode segments have the same shape and area.

In at least one embodiment for each group the photodiode segments are evenly spread about the common center of symmetry, respectively. Furthermore, for each group, the photodiode segments are arranged in pairs of opposing photodiode segments, respectively. The pairs are arranged opposite to each and other, i.e. with respect to the common center of symmetry. For each pair the opposing photodiode segments are point invariant about the common point of symmetry, respectively.

In at least one embodiment for each photodiode segment at least one side of its light sensitive area is aligned along an axis of symmetry. The axes of symmetry intersect in the common point of symmetry.

In at least one embodiment in each group, the sets of photodiode segments and the matched sets of photodiode segments are arranged in pairs of photodiode segments, respectively, each matched pair of photodiode segments is arranged with respect to at least one axis of symmetry. The arrangement of photodiode segments from said pair is opposite to each other with respect to said axis of symmetry, respectively.

In at least one embodiment in each matched pair of photodiode segments the photodiode segments are separated and/or isolated by a channel, respectively. The respective channel is aligned with the corresponding axis of symmetry, respectively.

In at least one embodiment the light sensitive areas of photodiode segments from different groups have different shape and area.

In at least one embodiment each group of photodiode segments comprises at least three or more photodiode segments.

In at least one embodiment each group of photodiode segments comprises the same number of photodiode segments.

In at least one embodiment the photodiode array is limited to an outer frame, in particular a rectangular outer frame.

In at least one embodiment the photodiodes are integrated into a common integrated circuit.

According to one aspect, a photodiode array comprises:

A first photodiode comprising a first set of spatially separate and electrically interconnected photodiode segments (D1'), A second photodiode comprising a second set of spatially separate and electrically interconnected photodiode segments (D2'), A first group (12) of photodiode segments comprising photodiode segments from the first and/or second set of photodiode segments, wherein the photodiode segments from the first group of photodiode segments are radially arranged around a common center of symmetry (C0) in a common first distance with respect to the common center of symmetry, and A second group (34) of photodiode segments comprising photodiode segments from the first and/or second set of photodiode segments, wherein photodiode segments from the second group of photodiode segments are radially arranged around the common center of symmetry in a second common distance with respect to the common center of symmetry, wherein the first distance is different from the second distance.

According to another aspect, the photodiode array further comprises:

At least a third photodiode comprising a third set of spatially separate and electrically interconnected photodiode segments (D3', D4', D5', D6'), and At least a third group (56) of photodiode segments comprising photodiode segments from the first, second and/or third set of photodiode segments, wherein photodiode segments from the third group of photodiode segments are radially arranged around the common center of symmetry and in a third common distance with respect to the common center of symmetry.

According to another aspect the photodiode array is complemented such that:
Each photodiode has an area matched counterpart photodiode forming a matched pair of photodiodes,
The matched counterpart photodiodes comprise a matched set of spatially separate and electrically interconnected photodiode segments, and
Each group of photodiode segments comprises the corresponding matched set of photodiode segments.

According to another aspect the photodiode array is complemented such that:
At least one photodiode comprises an interdigitated set of spatially separate and electrically interconnected photodiode segments, and
A group of interdigitated photodiode segments (IR) comprises the interdigitated set of photodiode segments, and/or other groups of photodiode segments comprises the interdigitated set of photodiode segments, and
The photodiode segments from the interdigitated set of photodiode segments are radially arranged around the common center of symmetry.

According to another aspect the photodiode array is complemented such that light sensitive surface areas of the photodiode segments have a non-rectangular shape.

According to another aspect the photodiode array is complemented such that within each group of photodiode segments the light sensitive surface areas of the photodiode segments have the same shape and area.

According to another aspect the photodiode array is complemented such that:
For each group, the photodiode segments are evenly spread about the common center of symmetry, respectively,
For each group, the photodiode segments are arranged into pairs of opposing photodiode segments and with respect to the common center of symmetry, respectively, and
For each pair, the opposing photodiode segments, with respect to area and position, are point invariant about the common point of symmetry, respectively.

According to another aspect the photodiode array is complemented such that:
For each photodiode segment, at least one side of its light sensitive area is aligned along an axis of symmetry (X, Y, XY, XY'), and
The axes of symmetry (X, Y, XY, XY') intersect in the common point of symmetry (C0).

According to another aspect the photodiode array is complemented such that:
In each group, the set of photodiode segments and the matched set of photodiode segments are arranged in matched pairs of photodiode segments, respectively, and
Each matched pair of photodiode segments is arranged with respect to at least one axis of symmetry (X, Y, XY, XY'), such that the photodiode segments from said pair are opposite to each other with respect to said axis of symmetry (X, Y, XY, XY'), respectively.

According to another aspect the photodiode array is complemented such that in each matched pair of photodiode segments, the photodiode segments are separated by a respective channel (CH1, CH2, CH3, CH4, CH15, CH26), and the respective channel is aligned with the corresponding axis of symmetry (X, Y, XY, XY'), respectively.

According to another aspect the photodiode array is complemented such that the light sensitive areas of photodiode segments from different groups have different shape and area.

According to another aspect the photodiode array is complemented such that each group of photodiode segments comprises at least three or more photodiode segments.

According to another aspect the photodiode array is complemented such that each group of photodiode segments comprises the same number of photodiode segments.

According to another aspect the photodiode array is complemented such that the photodiode array is limited to an outer frame (FR), in particular a rectangular outer frame.

According to another aspect the photodiode array is complemented such that the photodiodes are integrated into a common integrated circuit.

In the following, the concept presented above is described in further detail with respect to drawings, in which exemplary embodiments are presented.

DETAILED DESCRIPTION

Figure 1:
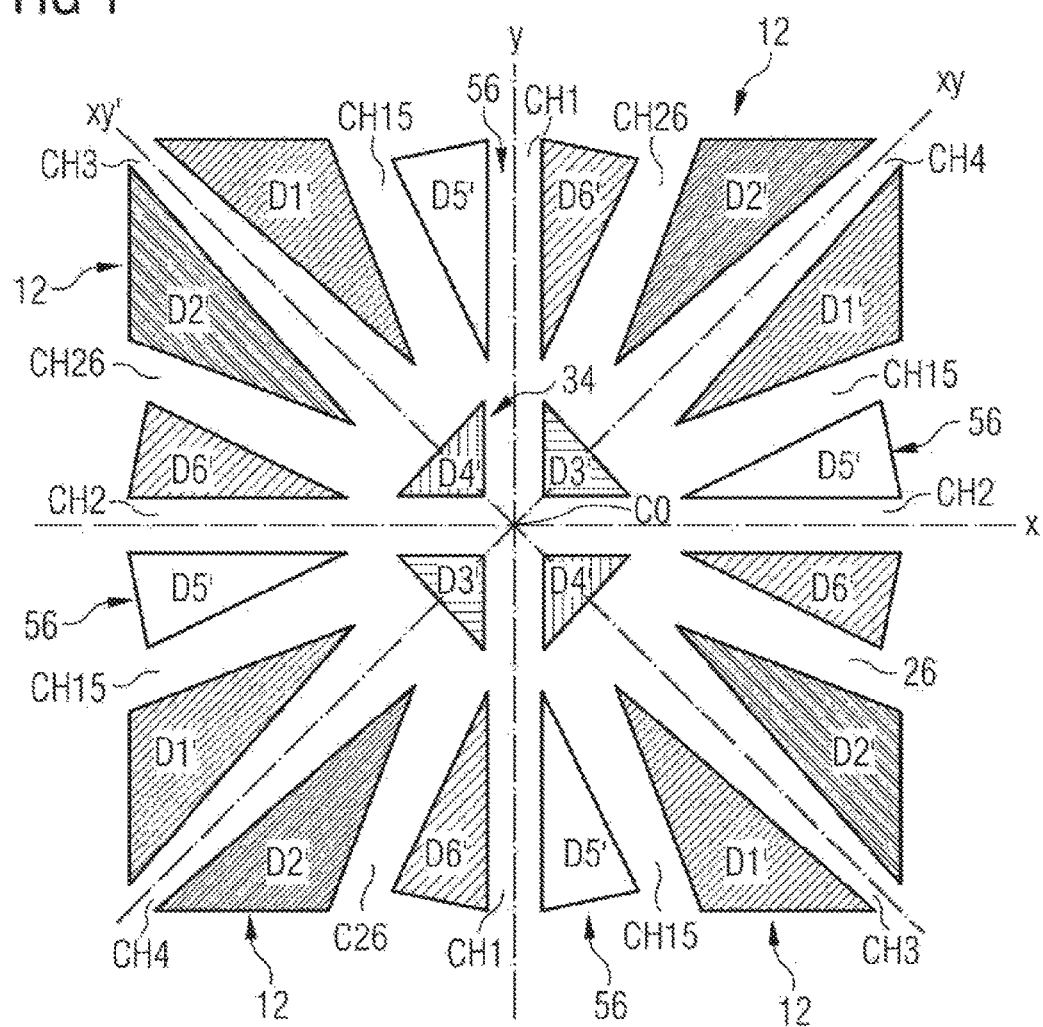
FIG. 1 shows an embodiment of a photodiode array according to the present concept.

FIG. 1 shows an embodiment of the photodiode array according to the present concept.

The photodiode array comprises six photodiodes D1, D2, D3, D4, D5, and D6. The photodiodes are further subdivided into several photodiode segments D1', D2', D3', D4', D5' and D6', respectively. The photodiodes D1, D2, D3, D4, D5, and D6 thus each comprise sets of electrically interconnected segments D1', D2', D3', D4', D5' and D6', respectively. For example, all photodiode segments with reference numeral D1' are electrically interconnected and form a first set of respective photodiode segments. The resulting set constitutes a first photodiode D1. In a similar way, the remaining photodiode segments with a reference numeral D2', D3', D4', D5' and D6' are electrically interconnected and form respective sets of photodiode segments. The resulting sets constitute a second, a third, a fourth, a fifth, and a sixth photodiode D2, D3, D4, D5, and D6, respectively.

In this particular embodiment the first and second photodiodes D1 and D2, third and fourth photodiodes D3 and D4, and fifth and sixth photodiodes D5 and D6 are matched, i.e. have the same shape and area of their respective light sensitive areas. In other words, the first and second, third and fourth, and fifth and sixth photodiodes form matched pairs of photodiodes, respectively.

The individual photodiode segments have a non-rectangular shape, i.e. edges to not meet in right angles. However, all photodiode segments D1', D2', D3', D4', D5' and D6' from the same set have the same shape and area. Furthermore, as the photodiodes D1, D2, D3, D4, D5, and D6 are matched in pairs also the corresponding photodiode segments D1', D2', D3', D4', D5' and D6' are matched in pairs. For example, the photodiode segments D1' from the first set constituting the first photodiode D1 and the photodiode segments D2' from the second set constituting the second photodiode D2 are matched in pairs, i.e. have the same shape and area. In a similar way, the remaining photodiode segments are matched in pairs as well. This property can be abbreviated as $$D1 = c_1 \cdot D1' = c_2 \cdot D2' = D2,$$

$$D3 = c_3 \cdot D3' = c_4 \cdot D4' = D4,$$

$$D5 = c_5 \cdot D5' = c_6 \cdot D6' = D6.$$

It is important to note, however, that neither photodiodes nor photodiode segments from a given pair are electrically interconnected. Furthermore, the total area, or diode ratio Dtot, of all matched photodiodes in the photodiode array can be abbreviated as follows:

$$\text{Dtot} = c_1 \cdot D1' + c_2 \cdot D2' + c_3 \cdot D3' + c_4 \cdot D4' + c_5 \cdot D5' + c_6 \cdot D6',$$

wherein $c_1$, $c_2$, $c_3$, $c_4$, $c_5$, and $c_6$ denote the number of photodiode segments into which the photodiodes are divided, respectively.

The photodiode array has a common center of symmetry C0. The photodiodes and photodiode segments are symmetrically arranged around the common center of symmetry C0. The symmetric arrangement can be described with respect to several axes of symmetry.

A center group 34 comprises the third and fourth photodiode segments D3', D4'. These photodiode segments are evenly distributed around the common center of symmetry C0. Furthermore, all photodiode segments from the center group have the same common distance d34 with respect to the center of symmetry C0. For example, the photodiode segments D3', D4' from the center group 34 have matched triangular shape. Their corresponding edges and vertices are point symmetric about the center of symmetry C0. For example, the edges closest to the center of symmetry lie on a common circle, i.e. have the same common distance d34 with respect to the center of symmetry C0. Each matched pair of photodiode segments is symmetric about a first or a second axis of symmetry X, Y.

In a similar way a first outer group 56 comprises the fifth and sixth photodiode segments D5', D6'. These photodiode segments are also evenly distributed around the common center of symmetry C0. Furthermore, all photodiode segments D5', D6' from the first outer group 56 have a first common distance d56 with respect to the center of symmetry C0. For example, the photodiode segments D5', D6' from the first outer group 56 have matched triangular shape. Their corresponding edges and vertices are also point symmetric about the center of symmetry C0. For example, the edges closest to the center of symmetry C0 lie on a common circle, i.e. have the same common distance d56 with respect to the center of symmetry C0. Each matched pair of photodiode segments D5', D6' from the first outer group 56 is symmetric with respect to the first or second axis of symmetry X, Y.

A second outer group 12 of photodiode segments comprises the first and second photodiode segments D1', D2'. These photodiode segments are also evenly distributed around the common center of symmetry C0. Furthermore, all photodiode segments from the second outer group 12 have a second common distance d12 with respect to the center of symmetry C0. This second common distance d12 does not necessarily be the same as the first common distance d56 of the first outer group 56.

For example, the photodiode segments D1', D2' from the second outer group 12 have matched triangular shape as well (which may be different from the triangular shape of the first outer group segments D5', D6'). Their corresponding edges and vertices are also point symmetric about the center of symmetry C0. For example, the edges closest to the center of symmetry C0 lie on another common circle, i.e. have the same common distance d12 with respect to the center of symmetry. Each matched pair of photodiode segments D1', D2' from the second outer group 12 is symmetric about the first or second axis of symmetry X, Y but also of a third or fourth axis of symmetry XY, XY'.

In a certain sense the photodiode array comprises different levels of symmetry. First, the matching of photodiodes and photodiode segments constitutes a symmetry in both light sensitive area and shape. Second, the arrangement of photodiode segments in groups and sets of segments with respect to the common center of symmetry and with respect to certain axes of symmetry implements also spatial symmetry.

The photodiode segments can be closely arranged and grouped together to cover a large amount of a total area of the array. Depending on the particular shape and geometry of the photodiode segments gaps between the individual segments can be kept rather small. The space between the photodiode segments can be filled by respective channels which can be used for electrical interconnection within sets of photodiode segments and, correspondingly, can be used to address single photodiode segments. The channels also serve as isolation between photodiode segments. In the drawing channels CH1, CH2, CH3, and CH4 are channels between matched photodiode segments. Additional channels are present between photodiode segments from different matched pairs, such as CH26 and CH15. Furthermore, yet another isolation channel CH5 can be aligned with the outer frame FR and frames the groups of photodiode segments.

The photodiode array is framed by a rectangular outer frame FR which defines the total area of the array. In this particular embodiment vertices of the first and second photodiode segments D1', D2' are aligned with the rectangular outer frame FR. The photodiode array can be integrated into an integrated circuit. The integrated circuit can be used as an optical sensor in various fields of application such as proximity detection, color sensing, gesture detection and ambient light sensing.

In another embodiment (not shown) the photodiode segments shown in FIG. 1 can have different shapes such as other non-rectangular regular or irregular geometries including pentagons and hexagons, for example.

Figure 2:
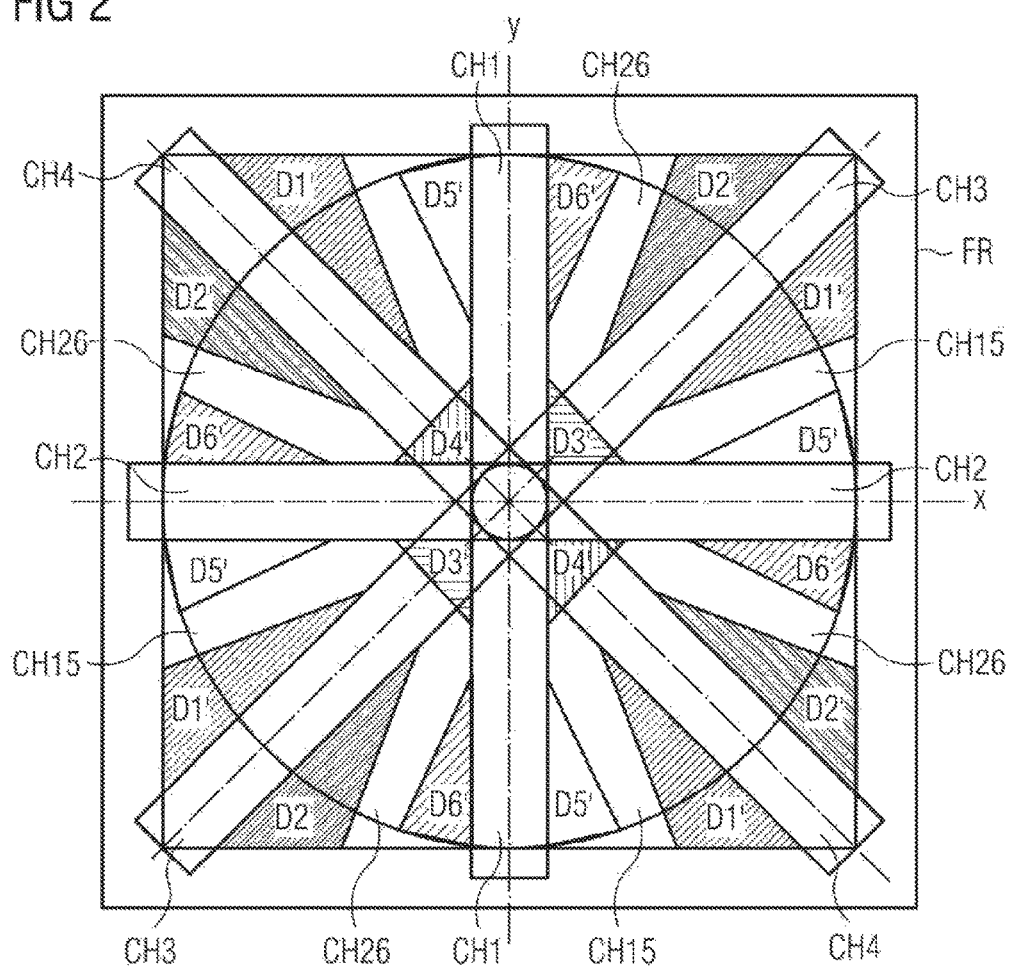
FIG. 2 shows another embodiment of a photodiode array according to the present concept.

FIG. 2 shows another embodiment of a photodiode array according to the present concept.

This embodiment is based on the photodiode array discussed with respect to FIG. 1. The photodiode array essentially comprises the same photodiodes and groups of photodiode segments as the array of FIG. 1. The individual photodiode segments have non-rectangular geometries, however, the shape deviates from a triangle. Furthermore, not only vertices of the first and second photodiode D1', D2' segments are aligned with respect to the rectangular outer frame FR but also vertices from the fifth and sixth photodiode D5', D6' segments are aligned. This allows to further improve the use of the available space and fill possible gaps. Moreover, four channels CH1, CH2, CH3, CH4 are depicted and aligned with respect to the axes of symmetry X, Y, XY, XY' respectively. These channels CH1, CH2, CH3, CH4 meet in the center of the photodiode array in an area around the common center of symmetry C0. Further vertices of the photodiode segments are aligned along these channels CH1, CH2, CH3, CH4. Further channels CH15, CH26, and CH5 are not depicted for illustration reasons.

Figure 3:
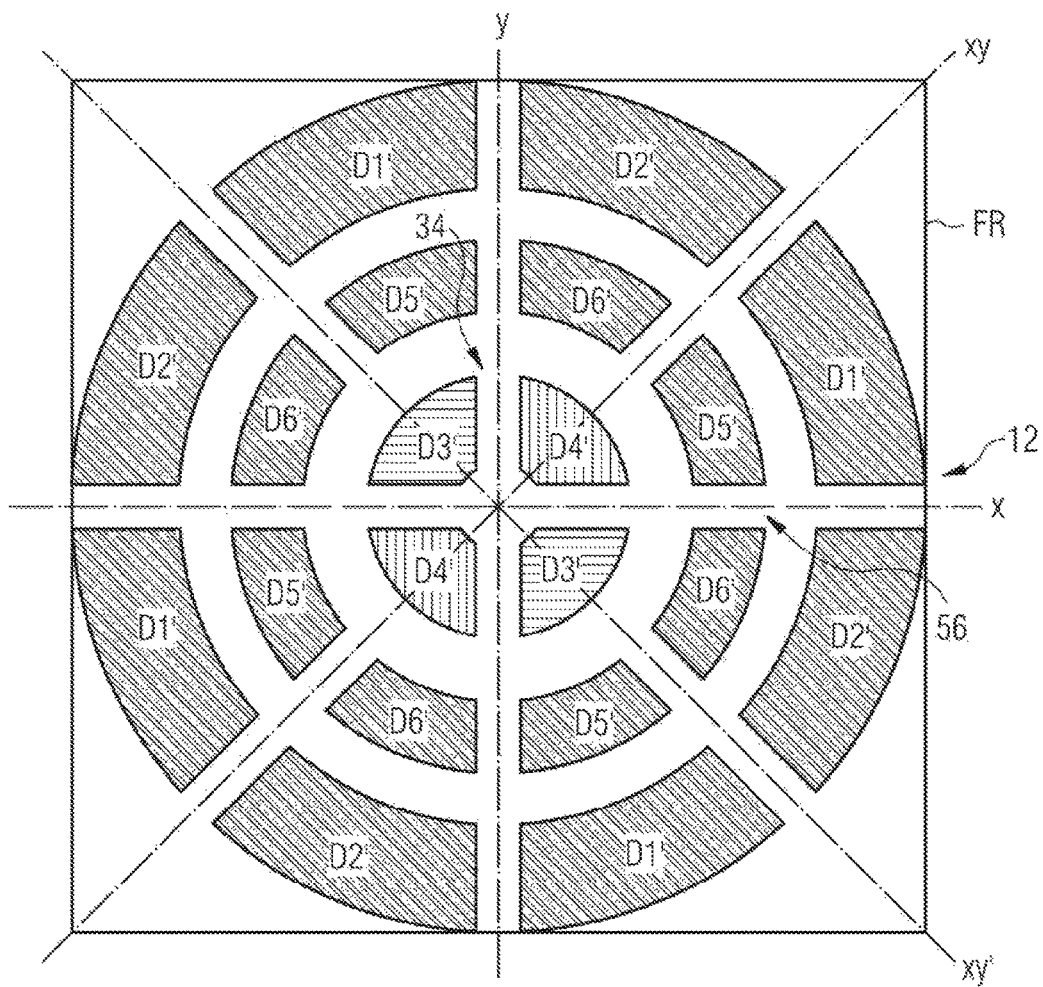
FIG. 3 shows another embodiment of a photodiode array according to the present concept.

FIG. 3 shows another embodiment of the photodiode array according to the present concept.

The depicted embodiment is similar to the ones shown with respect to FIGS. 1 and 2 in that the center group 34 of photodiode segments and the first and second outer groups 34, 56 of photodiode segments are implemented around the common center of symmetry C0. Furthermore, the symmetry concepts with respect to same shape and area and arrangement with respect to symmetry axis and the common center of symmetry apply in an analogous manner also to the embodiment in FIG. 3.

However, the shape of the individual photodiode segments D1', D2', D3', D4', D5', D6' is not triangular or based on a polygon. At least one side of the photodiode segments is aligned along respective circles that can be drawn with the common center of symmetry C0 at its center.

In particular, the center group 34 comprising the third and fourth photodiode segments D3', D4' that have two sides which meet in a common edge under a right angle. Opposite to said edges, however, is an arc of a circle, respectively. For example, the radius of this arc defines the common distance d34 for the center group 34. In a similar way to the previous FIGS. 1 and 2 the photodiode segments are arranged with respect to the axis of symmetry X and Y and a separated by respective channels CH1, CH2, CH3, CH4, respectively.

The fifth and sixth photodiode segments D5', D6' comprise arcs of a circle and are arranged radially around the common center of symmetry C0. In fact, the first outer group 56 of photodiode segments comprising the fifth and sixth photodiode segments D5', D6' forms an intermediate ring of photodiode segments arranged in the constant first common distance d56 with respect to the center of symmetry C0, i.e. the radius of the intermediate ring.

The first and second photodiode segments D1', D2' are arcs of another circle and are arranged radially around the common center of symmetry C0 too. In fact, this second outer group 12 of photodiode segments comprising the first and second photodiode segments D1', D2' forms an outer ring of photodiode segments which are arranged along the constant second common distance d12 with respect to the center of symmetry C0, i.e. the radius of the outer ring.

Figure 4:
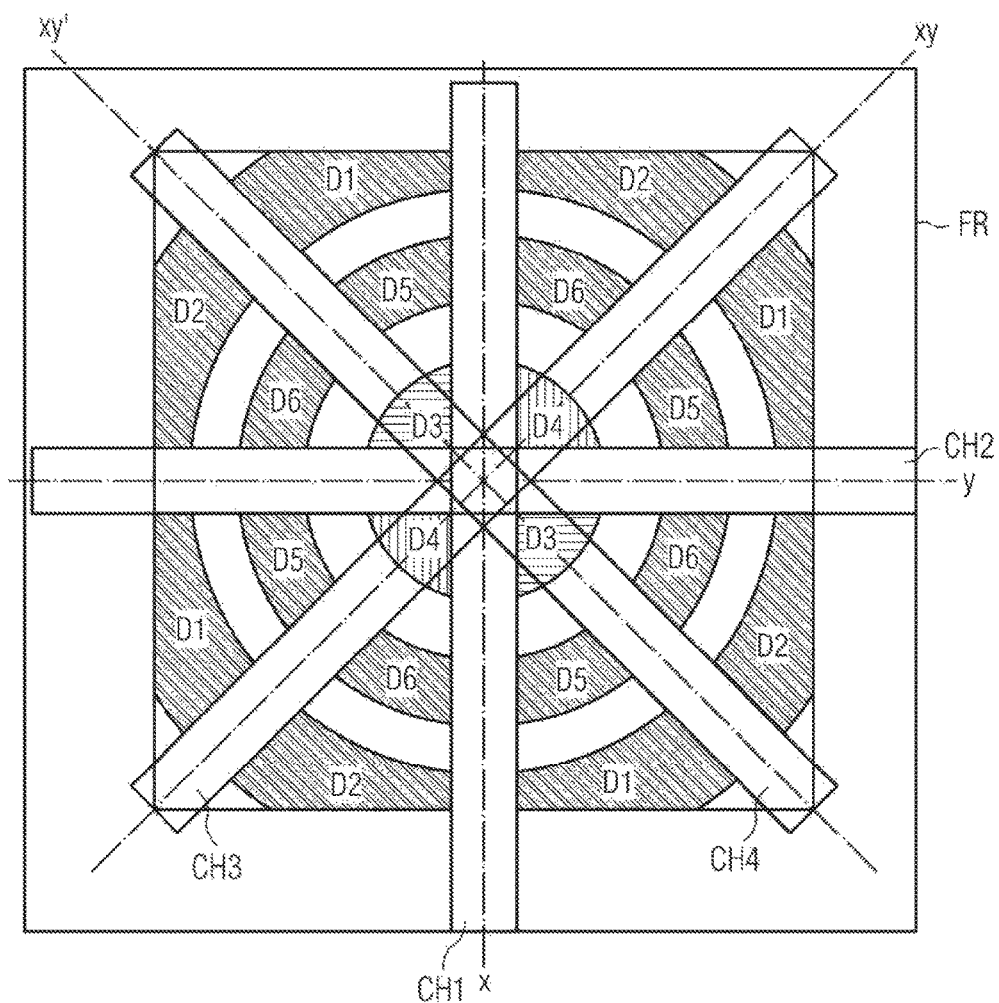
FIG. 4 shows another embodiment of a photodiode array according to the present concept.

FIG. 4 shows another embodiment according to the present concept.

This embodiment is based on the photodiode array discussed with respect to FIG. 3. In fact, the photodiode array essentially comprises the same photodiodes and groups of photodiode segments which are arranged in the same way as in FIG. 3. However, the shape of the photodiode segments D1', D2' is different and does not fully resemble an arc of a circle as in FIG. 3. Instead said photodiode segments have one arc which is aligned with a circle around the center of symmetry, e.g. having the second common distance d12 as radius. Instead of having a second arc, however, sides of the respective segments are aligned with the outer rectangular frame FR. Furthermore, the third and fourth photodiode segments D3', D4' and the fifth and sixth photodiode segments D5', D6' comprise sides which are aligned with channels CH1, CH2, CH3, CH4 respectively. Furthermore, circumferential channels are separating the center group 34 and the first outer groups 56 and the first and second outer groups 34, 56 of photodiode segments, respectively. This arrangement further improves on utilizing the available space.

Figure 5:
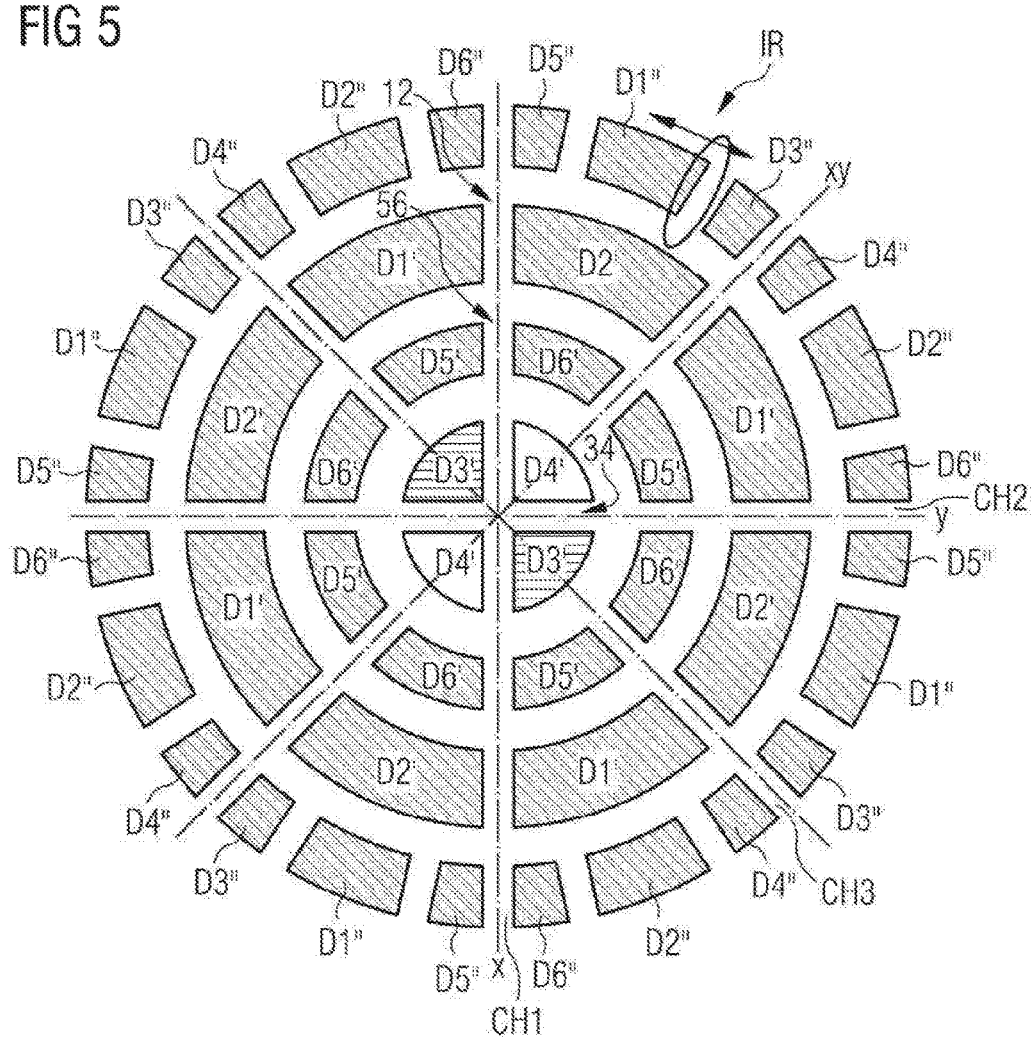
FIG. 5 shows another embodiment of a photodiode array according to the present concept.

FIG. 5 shows another embodiment of a photodiode array having interdigitated photodiode segments according to the present concept.

This embodiment is based on the photodiode array shown in FIG. 3. In fact, the array comprises the same center group 34, intermediate 56 and outer ring 12 comprising photodiode segments D1', D2', D3', D4', D5' and D6'. Furthermore, an interdigitated outer ring IR is arranged concentrically around the center of symmetry C0 in a distance dIR larger than the common distance d12 of the outer ring 12.

The interdigitated ring IR comprises a group of interdigitated photodiode segments D1", D2", D3", D4", D5" and D6". These interdigitated photodiode segments are spatially separate and spread around the common center of symmetry C0 within the interdigitated outer ring IR. The individual photodiode segments D1", D2", D3", D4", D5" and D6" from the group of interdigitated photodiode segments form part of the photodiodes in the array. For example, a first interdigitated photodiode segment D1" is electrically connected to the segments D1' from the first set of photodiode segments. Thus, the first photodiode D1 comprises a set of all first interdigitated photodiode segments D1" and the first set of photodiode segments D1'. Analogously, the same is true for sets of second, third, fourth, fifth and sixth interdigitated photodiode segments and their respective second, third, fourth, fifth and sixth sets of photodiode segments.

All interdigitated photodiode segments from the interdigitated outer ring IR are radially arranged around the common center of symmetry C0 in the common distance dIR. Said segments, however, do not necessarily have the same area and shape as their counterparts from other sets, i.e. the interdigitated photodiode segments D1", D2", D3", D4", D5" and D6" are typically not matched with those segments D1', D2', D3', D4', D5' and D6' from other groups. Nevertheless, interdigitated photodiode segments within the interdigitated outer ring IR can be arranged in matched pairs and with respect to axes of symmetry as indicated in the drawing.

Similar to the notation introduced above the interrelation of photodiode segments and interdigitates photodiode segments can be abbreviated as:

$$D1 = c_1 \cdot D1' + c_1 \cdot D1'' = c_2 \cdot D2' + c_2 \cdot D2'' = D2,$$

$$D3 = c_3 \cdot D3' + c_3 \cdot D3'' = c_4 \cdot D4' + c_4 \cdot D4'' = D4,$$

$$D5 = c_5 \cdot D5' + c_5 \cdot D5'' = c_6 \cdot D6' + c_6 \cdot D6'' = D6.$$

Furthermore, the total area, or diode ratio Dtot, of all matched photodiodes in the photodiode array meets the following relation:

$$Dtot = c_1 \cdot D1' + c_1 \cdot D1''$$

$$+ c_2 \cdot D2' + c_2 \cdot D2''$$

$$+ c_3 \cdot D3' + c_3 \cdot D3''$$

$$+ c_4 \cdot D4' + c_4 \cdot D4''$$

$$+ c_5 \cdot D5' + c_5 \cdot D5''$$

$$+ c_6 \cdot D6' + c_6 \cdot D6'',$$

wherein $c_1$, $c_2$, $c_3$, $c_4$, $c_5$, and $c_6$ denote the number of photodiode segments into which the photodiodes are divided.

Additional interdigitated ring patterns of photodiode segments are possible for added interdigitation. These diode ring bands can be further subdivided for added interdigitation. Sizing can be set to by diode segments inner and outer radii and placement of radial isolation channels. Furthermore, the inner rings 12 and 56 could also be interdigitated. For example, photodiode segments of photodiode D1 may comprise interdigitated photodiode segments D1''' and D2''' and photodiode D2 may comprise interdigitated photodiode segments D2''' and D1'''. Generally, interdigitation can be added to a single, some or all groups of photodiode segments. This allows for an increased freedom in designing the photodiode array and adjust it to a given application.

Figure 6:
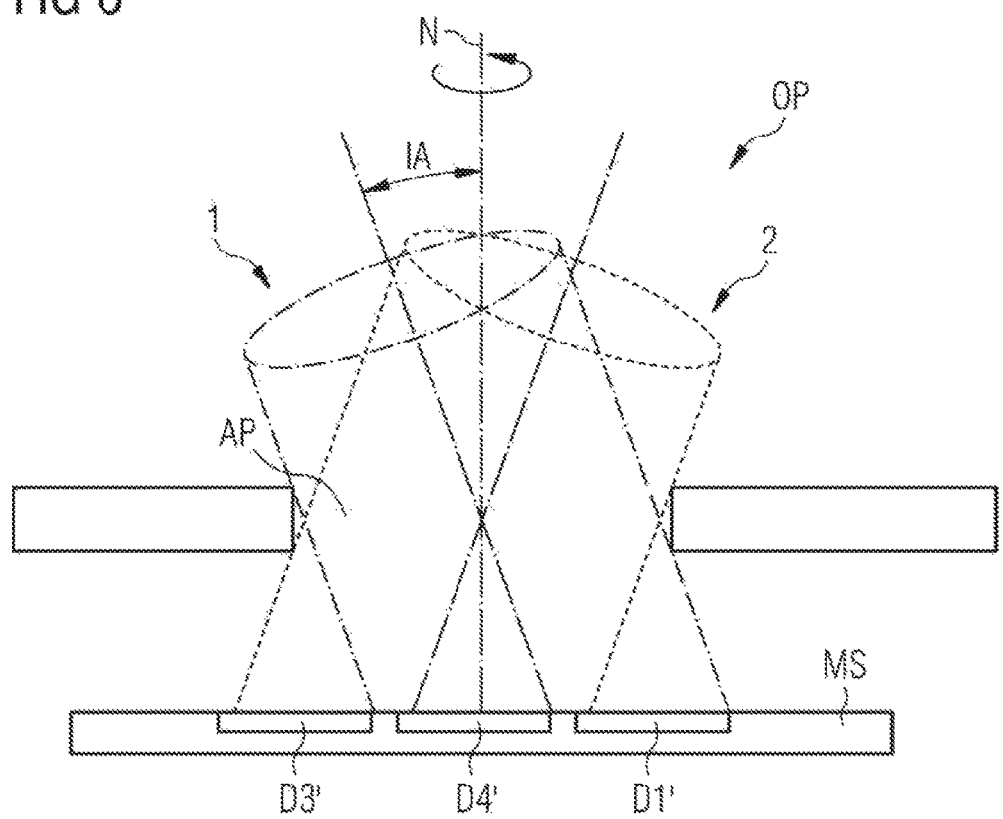
FIG. 6 shows a sectional view of exemplary optical paths of incident on- and off-axis irradiance for an optical sensor comprising a photodiode array according to the present concept.

FIG. 6 shows a sectional view of exemplary optical paths of incident on- and off-axis irradiance for an optical sensor comprising a photodiode array according to the present concept.

The sectional view shows an example of an optical sensor comprising a photodiode array. The optical sensor has an optical package OP, shown in profile view. The photodiode array comprises several photodiodes including groups of photodiode segments. In the drawing only photodiode segments D1', D3' and D4' are depicted for illustration.

The optical package OP has an aperture AP which allows for light to pass and strike one or more of the photodiode segments. Beams of light can strike the photodiode array, e.g. an on axis beam, perpendicular N to a main surface MS of photodiode array, and off axis beams. The purpose of this diagram is to show how an off axis light source will strike the main surface MS of the photodiode array and illuminate areas differently under a maximum irradiance angle IA than when the beam is on axis, i.e. IA=0 degrees.

Additionally an off axis beam may strike the photodiode array at different angles of rotation, e.g. 0 and 180 degrees. Looking directly down at optical sensor along the optical axis N, the off-axis beams 1, 2 could be viewed as originating from anywhere between 0 to 360 degrees. As the angle of beam rotation changes from 0 to 360 degrees, different photodiode segments are exposed to the beam. For example, with angular irradiance of 0 degrees, diode segment D1' and diode segment D4' are well exposed, but diode segment D3' gets very limited exposure. Likewise, when angular irradiance is 180 degrees, diode segment D3' and diode segment D4' are well exposed and diode segment D1' has very limited exposure. The photodiode arrays proposed by the present concept account for this exposure dependence on angular irradiance and implement means of compensation in order to reduce the effects of angular irradiance and improve on optical performance. The following figures show how the configuration and spatial arrangement of the proposed photodiode arrays reduce angular dependence and improve optical performance.

Figure 7:
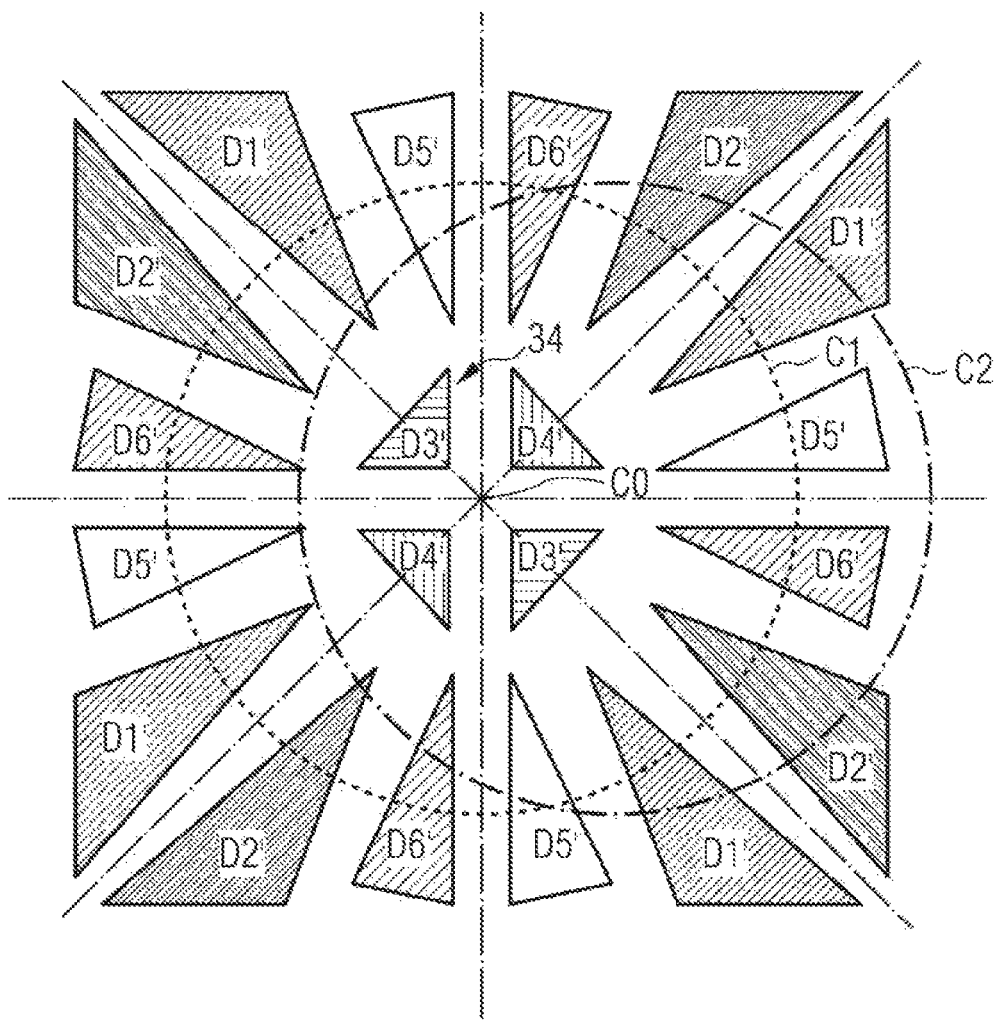
FIG. 7 shows a top view of exemplary optical paths of incident on- and off-axis irradiance for an optical sensor comprising a photodiode array according to the present concept.

FIG. 7 shows a top view of exemplary optical paths of incident on- and off-axis irradiance for an optical sensor comprising a photodiode array according to the present concept.

The drawing shows the photodiode array of FIG. 1 as an example. The concepts discussed here, however, can be applied to other embodiments as well. A first and a second circle C1, C2 are depicted which illustrate on axis and off axis illuminance patterns overlaid upon the photodiode segments. The dashed first circle C1 represents the on axis condition and dot dashed second circle C2 represents the off axis condition. It can be seen that for the off axis condition diode photodiode segments on the right portion of the photodiode array get more direct exposure while photodiode segments on the left portion are less exposed to a light source. This counter balancing action helps to preserve the photodiode set matching as well as the diode total ratio, Dtot, resulting in improved insensitivity to off axis conditions.

Figure 8:
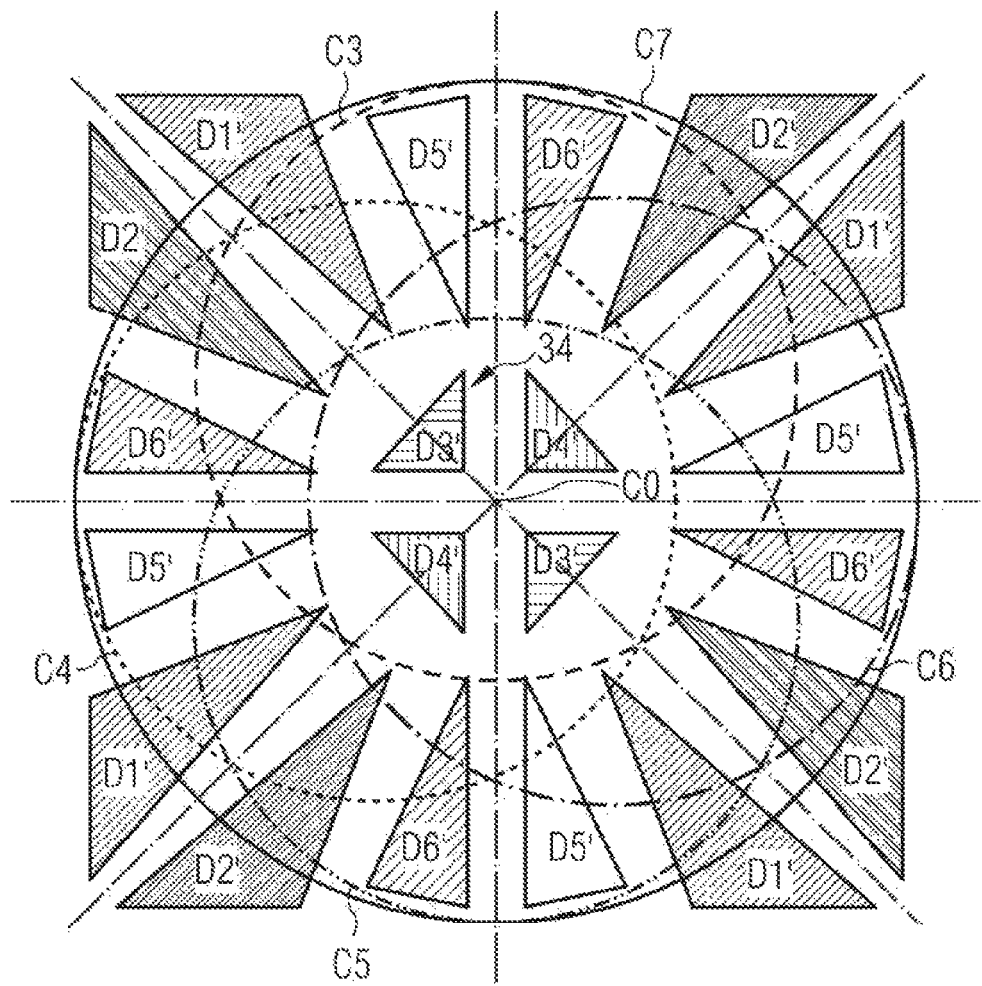
FIG. 8 shows another top view of exemplary optical paths of incident on- and off-axis irradiance for an optical sensor comprising a photodiode array according to the present concept.

FIG. 8 shows another top view of exemplary optical paths of incident on- and off-axis irradiance for an optical sensor comprising a photodiode array according to the present concept.

The drawing shows the photodiode array of FIG. 1 as an example. A third, fourth, fifth and sixth circles C3, C4, C5, and C6 indicate irradiation from light sources from multiple angular directions, i.e. 0, 90, 180 and 270 degrees, respectively. It can be seen that due to the proposed multi segmented photodiode structure, common centroid C0 placement and radial arrangement, regardless of the light source angle, photodiode exposure and ratio of the total sensitive area Dtot remain essentially constant and within circle C7. For example, this can be illustrated with photodiode segments D5', D5 and photodiode segments D6'. At each angular direction, at the extreme edge of the irradiance circle pattern, one photodiode segment D5' and one photodiode segment D6' fails to be exposed. For 0 degrees, the extreme left one photodiode segment D5' and D6' are not exposed. For 270 degrees, however, the extreme upper one photodiode segment D5' and D6' are not exposed.

REFERENCE NUMERALS 1 off-axis beam
2 off-axis beam
12 group of photodiode segments
34 group of photodiode segments
56 group of photodiode segments
AP aperture
C0 center of symmetry
C1 to C7 circles
CH1 channel
CH2 channel
CH3 channel
CH4 channel
CH15 channel
CH26 channel
d12 distance
d34 distance
d56 distance
dIR distance
D1 to D6 photodiode
D1' to D6' photodiode segments
D1'' to D6'' interdigitated photodiode segments
FR outer frame
IA irradiance angle
IR interdigitated ring of photodiode segments
N optical axis, surface normal
OP optical package
X axis of symmetry
Y axis of symmetry
XY axis of symmetry

The invention claimed is:
1. A photodiode array, comprising:
A first photodiode comprising a first set of spatially separate and electrically interconnected photodiode segments,

A second photodiode comprising a second set of spatially separate and electrically interconnected photodiode segments, A first group of photodiode segments comprising photodiode segments from the first and/or second set of photodiode segments, wherein the photodiode segments from the first group of photodiode segments are radially arranged around a common center of symmetry in a common first distance with respect to the common center of symmetry, and A second group of photodiode segments comprising photodiode segments from the first and/or second set of photodiode segments, wherein photodiode segments from the second group of photodiode segments are radially arranged around the common center of symmetry in a second common distance with respect to the common center of symmetry, wherein the first distance is different from the second distance, and wherein Each photodiode has an area matched counterpart photodiode forming a matched pair of photodiodes, The matched counterpart photodiodes comprise a matched set of spatially separate and electrically interconnected photodiode segments, and Each group of photodiode segments comprises the corresponding matched set of photodiode segments.

2. The photodiode array according to claim 1, further comprising:
At least a third photodiode comprising a third set of spatially separate and electrically interconnected photodiode segments, and
At least a third group of photodiode segments comprising photodiode segments from the first, second and/or third set of photodiode segments, wherein photodiode segments from the third group of photodiode segments are radially arranged around the common center of symmetry and in a third common distance with respect to the common center of symmetry.

3. The photodiode array according to claim 1, wherein
At least one photodiode comprises an interdigitated set of spatially separate and electrically interconnected photodiode segments, and
A group of interdigitated photodiode segments comprises the interdigitated set of photodiode segments, and/or other groups of photodiode segments comprises the interdigitated set of photodiode segments, and
The photodiode segments from the interdigitated set of photodiode segments are radially arranged around the common center of symmetry.

4. The photodiode array, according to claim 1, wherein light sensitive surface areas of the photodiode segments have a non-rectangular shape.

5. The photodiode array according to claim 4, wherein within each group of photodiode segments the light sensitive surface areas of the photodiode segments have the same shape and area.

6. The photodiode array, according to claim 4, wherein
For each group, the photodiode segments are evenly spread about the common center of symmetry, respectively,
For each group, the photodiode segments are arranged into pairs of opposing photodiode segments and with respect to the common center of symmetry, respectively, and
For each pair, the opposing photodiode segments, with respect to area and position, are point invariant about the common point of symmetry, respectively.

7. The photodiode array according to claim 4, wherein
For each photodiode segment, at least one side of its light sensitive area is aligned along an axis of symmetry, and
The axes of symmetry intersect in the common point of symmetry.

8. The photodiode array according to claim 7, wherein
In each group, the set of photodiode segments and the matched set of photodiode segments are arranged in matched pairs of photodiode segments, respectively, and
Each matched pair of photodiode segments is arranged with respect to at least one axis of symmetry, such that the photodiode segments from said pair are opposite to each other with respect to said axis of symmetry, respectively.

9. The photodiode array according to claim 8, wherein in each matched pair of photodiode segments, the photodiode segments are separated by a respective channel, and the respective channel is aligned with the corresponding axis of symmetry, respectively.

10. The photodiode array according to claim 4, wherein the light sensitive areas of photodiode segments from different groups have different shape and area.

11. The photodiode array according to claim 1, wherein each group of photodiode segments comprises at least three or more photodiode segments.

12. The photodiode array according to claim 1, wherein each group of photodiode segments comprises the same number of photodiode segments.

13. The photodiode array according to claim 1, wherein the photodiode array is limited to an outer frame or a rectangular outer frame.

14. The photodiode array according to claim 1, wherein the photodiodes are integrated into a common integrated circuit.

* * * * *